United States Patent
Novoselov et al.

(10) Patent No.: US 9,639,800 B2
(45) Date of Patent: May 2, 2017

(54) PRINTED RADIO FREQUENCY SENSOR STRUCTURE AND A METHOD OF PREPARING A RFID SENSOR TAG

(71) Applicants: Konstantin Novoselov, Manchester (GB); Chung Ping Lai, Zhubei (TW); Kuo-Hsin Chang, Manchester (GB); Jia-Cing Chen, Manchester (GB)

(72) Inventors: Konstantin Novoselov, Manchester (GB); Chung Ping Lai, Zhubei (TW); Kuo-Hsin Chang, Manchester (GB); Jia-Cing Chen, Manchester (GB)

( * ) Notice: Subject to any disclaimer, the term of this patent is extended or adjusted under 35 U.S.C. 154(b) by 0 days.

(21) Appl. No.: 14/824,083

(22) Filed: Aug. 12, 2015

(65) Prior Publication Data

US 2017/0046610 A1 Feb. 16, 2017

(51) Int. Cl.
*G06K 19/077* (2006.01)
*H05K 3/12* (2006.01)

(52) U.S. Cl.
CPC ... *G06K 19/0776* (2013.01); *G06K 19/07775* (2013.01); *H05K 3/12* (2013.01)

(58) Field of Classification Search
CPC combination set(s) only.
See application file for complete search history.

(56) References Cited

U.S. PATENT DOCUMENTS

| | | | | |
|---|---|---|---|---|
| 7,304,578 B1* | 12/2007 | Sayers | ............... | G06K 19/0723 340/572.1 |
| 7,900,844 B2* | 3/2011 | Alden | ............... | G06K 19/07749 235/375 |
| 7,969,307 B2* | 6/2011 | Peeters | ................ | A61B 5/0002 340/572.1 |
| 8,220,836 B2* | 7/2012 | Chatte | .............. | G07B 17/00508 281/2 |
| 2014/0139319 A1* | 5/2014 | Jones | ................. | G06K 19/0716 340/10.1 |
| 2014/0315592 A1* | 10/2014 | Schlub | ................. | H04B 1/3838 455/522 |
| 2015/0129283 A1* | 5/2015 | Xiao | ........................ | H01Q 1/38 174/250 |
| 2016/0006115 A1* | 1/2016 | Etzkorn | ................... | H01Q 1/40 343/867 |

* cited by examiner

*Primary Examiner* — Christle I Marshall

(57) ABSTRACT

A printed radio frequency sensor structure contains: a substrate, a RF antenna arranged on a top surface of the substrate, and a protection layer covering on the RF antenna arranged, wherein plural sensing materials are directly introduced into a RF antenna mixture of the RF antenna. A method of preparing a RFID sensor tag comprising steps of: A). Printing conductive sensing ink/glue on substrate; B). Drying, curing and compressing the conductive sensing ink/glue to form a conductive antenna mixture with plural sensing materials; C). Bonding a chip on a RFID sensing antenna to form a RFID sensor tag; and D). Coating a protection layer on a top of the RFID sensor tag. Here note protection coating can fully, partially or no cover the conductive sensing antenna.

5 Claims, 5 Drawing Sheets

- I. Conductor particles
- II. Binder
- III. Sensing material A: Metal particles
- III. Sensing material B: Carbon materials
- III. Sensing material C: Polymers
- III Sensing material D: Organically modified species

PRINTED RADIO FREQUENCY SENSOR STRUCTURE AND A METHOD OF PREPARING A RFID SENSOR TAG

FIELD OF THE INVENTION

The present invention relates to a printed radio frequency sensor structure in which a direct combination of plural sensing materials to different species of interest that lets RF sensor has capability to detect various target species at one RF sensor.

BACKGROUND OF THE INVENTION

Wireless sensors are devices in which sensing electronic transducers are separated from their associated readout/display components. Wireless sensors had been applied in temperature, pressure, and pH value. It also can be found in monitoring of many gases such as volatile organic compounds, toxic industrial chemicals, and chemical warfare agents in relatively interference-free industrial and indoor environments.

However, in these practical gas sensing applications, the available wireless gas sensors are not easy to meet the sensing requirements in complex environments.

To solve the fundamental selectivity and sensitivity issues, a combination of the three key sensor system components such as sensing material, transducer, and signal generation and processing techniques was utilized.

Until now, there are several battery-free passive wireless sensing technologies based on magneto-elastic, thickness shear mode, surface acoustic wave, magnetic acoustic resonance, and resonant LCR (inductor-capacitor-resistor) transducers.

Except for LCR transducers (RFID sensor tags), most of wireless sensing technologies request extra sensor IC circuits. RFID systems have been widely used in many applications ranging from logistics, to goods tracking, access control, automatic identification of animals, and so on.

With reference to FIG. 1, low frequency RFID systems (125-134 kHZ) and high frequency RFID systems (13.56 MHZ) have short transmission ranges from several centimeter up to 1 meter. Ultra-high frequency (UHF) RFID systems (860-960 MHZ) can cover a range up to 10 meters. Microwave frequency RFID systems (2.4 GHZ) cover transmission ranges up to 30 meters. For long distance sensing in security management and control system, only UHF and microwave RFID systems can meet the requirement.

Referring to FIG. 2, methods and systems for integrated interrogation of RFID sensors were disclosed in U.S. Pat. No. 8,717,146. To achieve accurate and precise sensing, several calculated spectral parameters, included the frequency position Fp and magnitude Zp of Zre(f) and the resonant F1 and anti-resonant F2 frequencies of Zim(f), were measured. When interest gas was adsorbed on surface of RFID sensor, dielectric constant of sensing film will change, which results in a shift on impendence parameters of RFID sensor antenna. According to this mechanism, LCR transducer (RFID sensor tag) becomes a promising wireless sensing technology.

An embodiment of a process for the fabrication of an RFID sensor has been illustrated. They also provided methods and systems for calibration of RFID sensors used in manufacturing and monitoring systems as disclosed in U.S. Pat. No. 7,911,345. For example, they proposed a selected sensing material applied onto the RFID antenna that altered its impedance response when interest gas was adsorbed on surface of sensing materials. A complementary sensor resistor and/or capacitor was also attached across an antenna and an IC memory chip to calibrate the sensor impedance response.

A sensing material layer directly coated on surface of HF and UHF RFID antenna has been disclosed in U.S. Publication No. 20140095102. In this design, one selected sensing material was coated on one tag, which is limited to only detect one target species by one tag.

For homeland security applications, long distance RFID sensor for detection of explosives is requested. So HF RFID sensor cannot be used in such long distance application.

Due to low vapor pressure of nitro explosive gases, how to improve the sensitivity, selectivity, reading range of present RF sensors is important issue for realizing it on homeland security applications. Requirements of explosive gas sensor contains be extremely sensitive, be highly selective, and be robust & stable.

The present invention has arisen to mitigate and/or obviate the afore-described disadvantages.

SUMMARY OF THE INVENTION

One aspect of the present invention is to provide a printed radio frequency sensor structure in which a direct combination of plural sensing materials to different species of interest that lets RF sensor has capability to detect various target species at one RF sensor.

Further aspect of the present invention is to provide a printed radio frequency sensor structure which has a benefit of high selectivity and sensitivity due to significant change of antenna impedance.

Another aspect of the present invention is to provide a method of preparing a RFID sensor tag which is a simple, energy-saved, and environmentally friendly.

To obtain the above aspects, a printed radio frequency sensor structure provided by the present invention contains: a substrate, a RF antenna arranged on a top surface of the substrate, and a protection layer covering on the RF antenna arranged, wherein plural sensing materials are directly introduced into a RF antenna mixture of the RF antenna, such that a change occurs on not only dielectric a constant of the sensing materials but also a resistance of the RF antenna, when target species are adsorbed on a surface of a sensing antenna.

In addition, a method of preparing a RFID sensor tag provided by the present invention contains steps of:
A). Printing conductive sensing ink/glue on substrate;
B). Drying, curing and compressing the conductive sensing ink/glue to form a conductive antenna mixture with plural sensing materials;
C). Bonding a chip on a RFID sensing antenna to form a RFID sensor tag; and
D). Coating a protection layer on a top of the RFID sensor tag. Here note protection coating can fully, partially or no cover the conductive sensing antenna.

Preferably, the conductive sensing ink/glue consists of two parts: conductive ink/glue and the plural sensing materials.

Preferably, a conductor in the conductive ink/glue is any one of metal, carbon, conductive polymer, and their derived mixtures.

Preferably, the selected sensing material is any one of metal, carbon, polymer, organically modified species, and their derived mixtures.

DETAILED DESCRIPTION OF THE PREFERRED EMBODIMENTS

Figure 1:
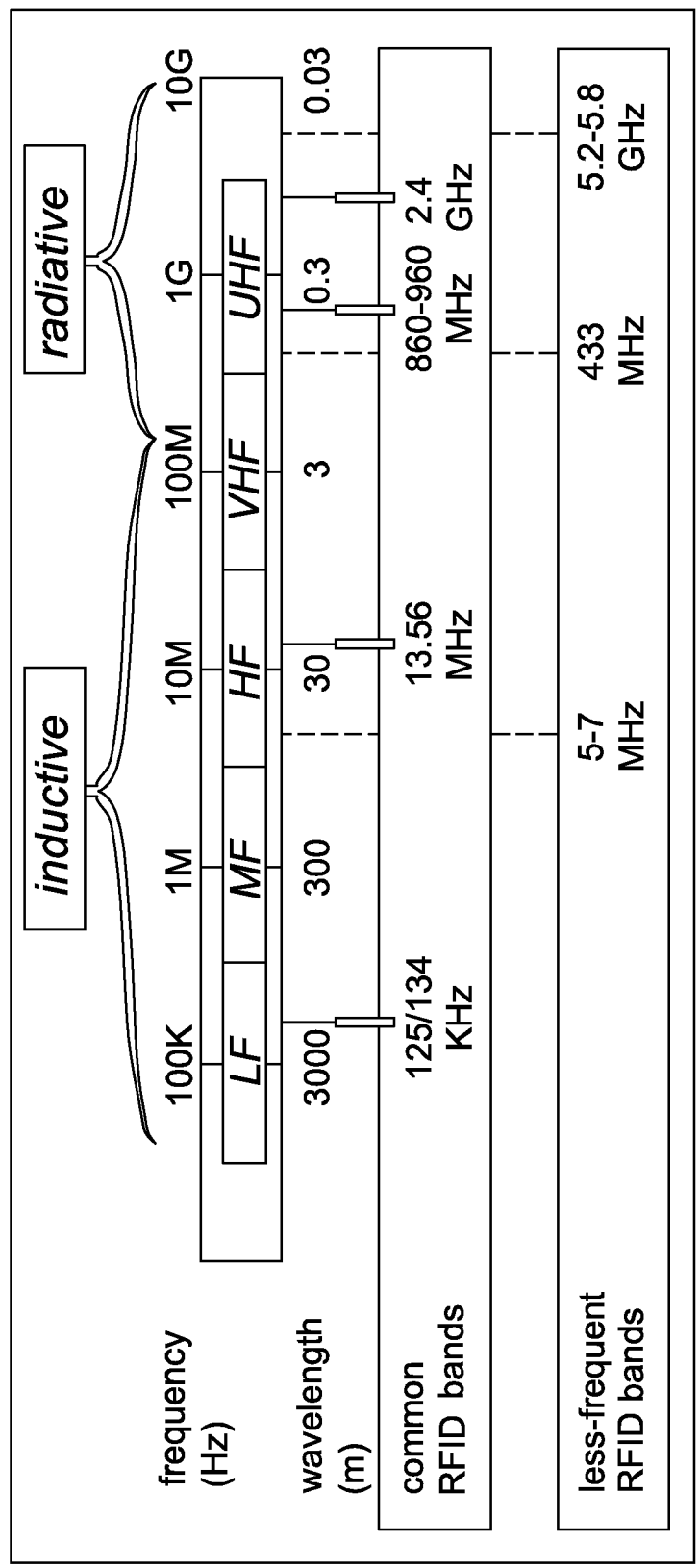
FIG. 1 is a diagram of conventional low frequency RFID systems and high frequency RFID systems.
Figure 2:
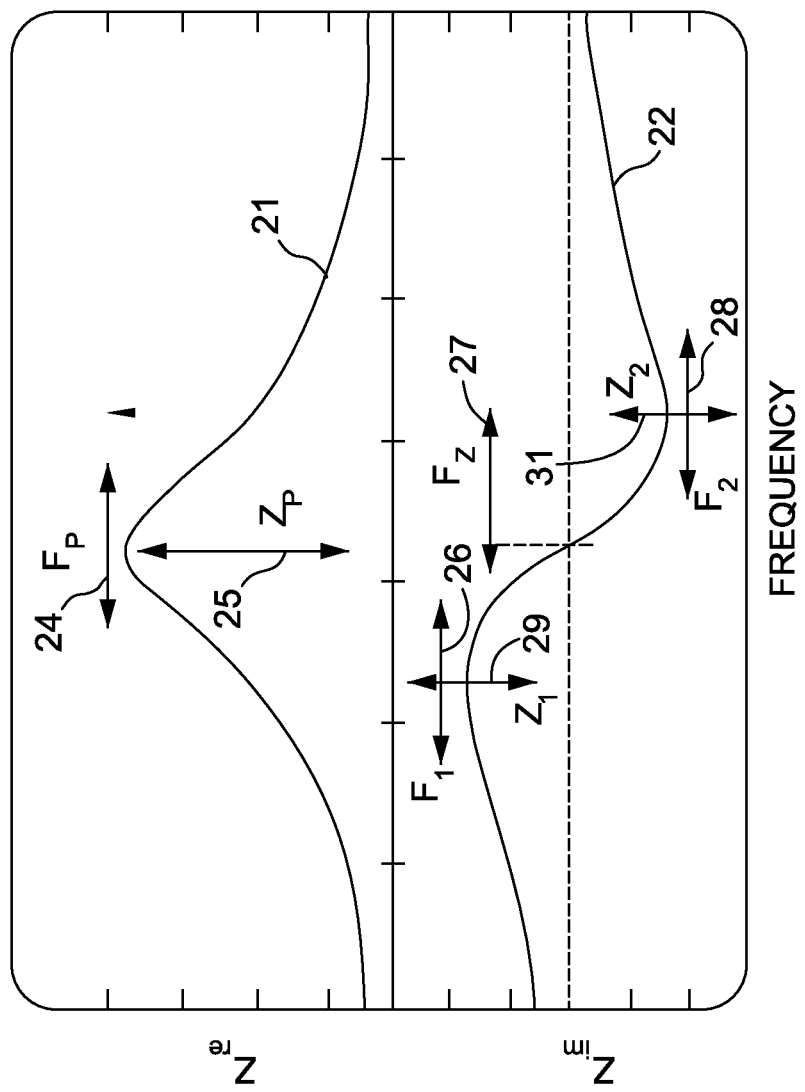
FIG. 2 is a diagram of conventional methods and systems for integrated interrogation of RFID sensors disclosed in U.S. Pat. No. 8,717,146.
Figure 3:
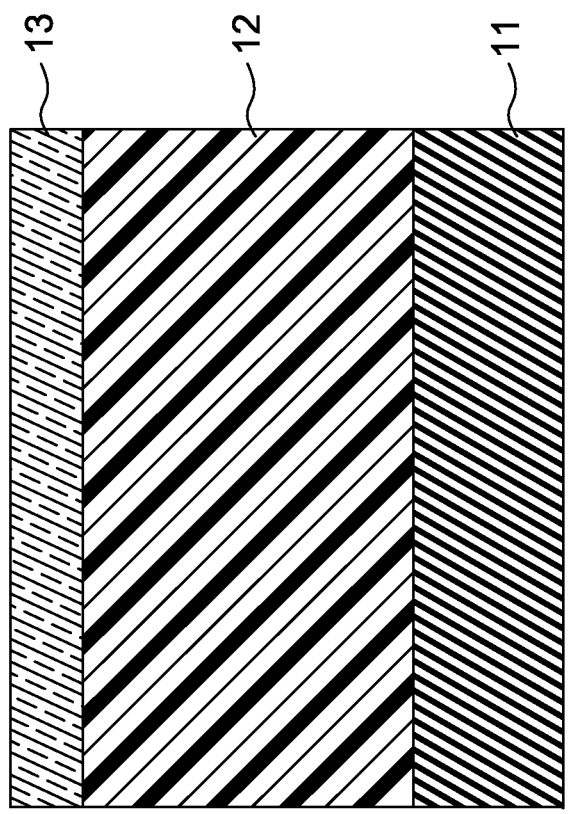
FIG. 3 is a side plane view showing the assembly of a printed radio frequency sensor structure according to a preferred embodiment of the present invention.

With reference to FIG. 3, a printed radio frequency sensor structure according to a preferred embodiment of the present invention comprises: a substrate 11, a RF antenna arranged 12 on a top surface of the substrate 11, and a protection layer 13 covering on the RF antenna arranged 12, wherein plural sensing materials are directly introduced into a RF antenna mixture of the RF antenna 12, such that a change occurs on not only dielectric a constant of the plural sensing materials but also a resistance of the RF antenna 12, when target species are adsorbed on a surface of a sensing antenna. So the printed radio frequency sensor structure of the present invention has a benefit of high selectivity and sensitivity due to significant change of antenna impedance.

Figure 4:
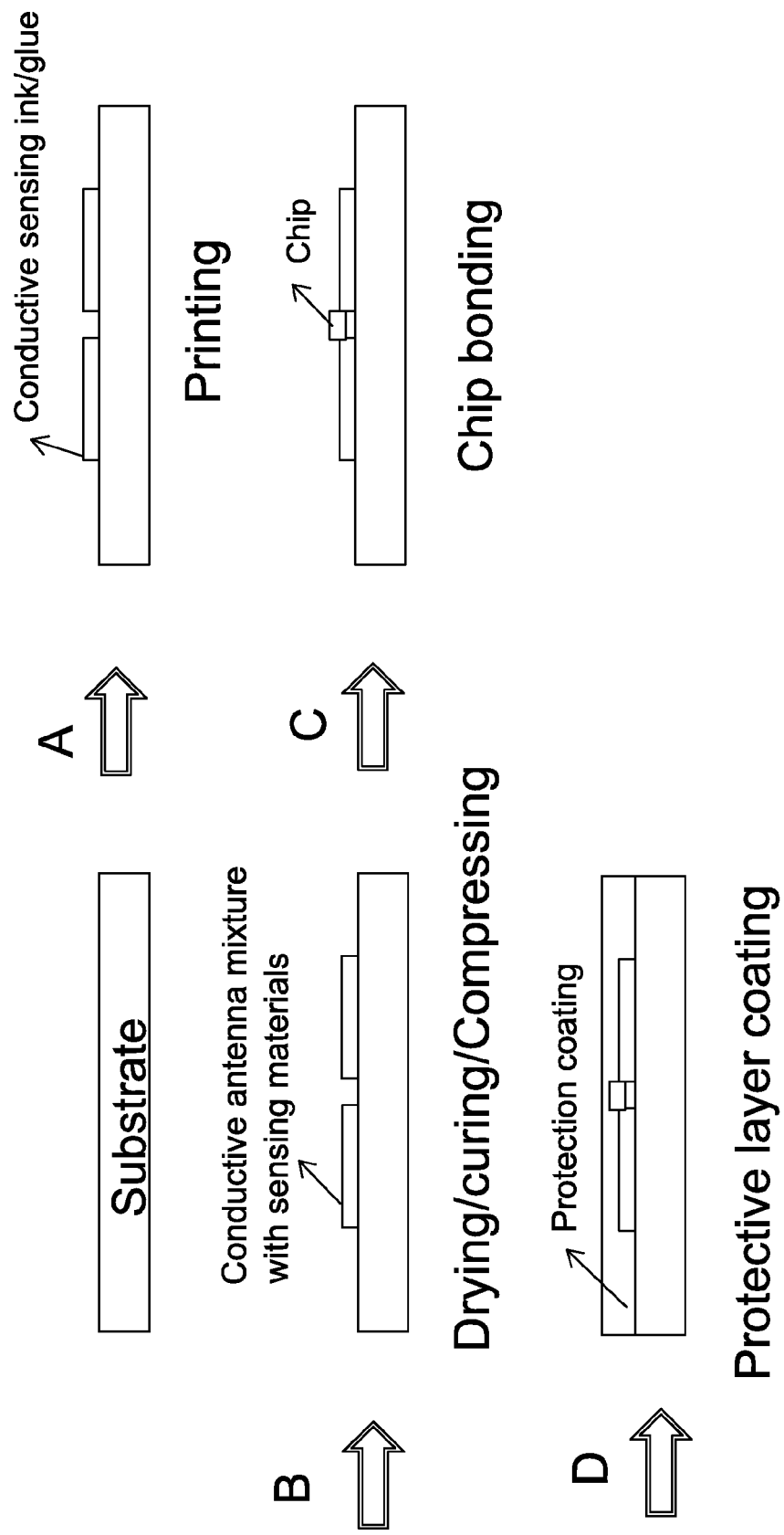
FIG. 4 is a flow chart of a method of preparing a RFID sensor tag according to a preferred embodiment of the present invention.

Referring to FIG. 4, a method of preparing a RFID sensor tag according to a preferred embodiment of the present invention comprises steps of:
A). Printing conductive sensing ink/glue on substrate;
B). Drying, curing and compressing the conductive sensing ink/glue to form a conductive antenna mixture with plural sensing materials;
C). Bonding a chip on a RFID sensing antenna to form a RFID sensor tag; and
D). Coating a protection layer on a top of the RFID sensor tag. Here note protection coating can fully, partially or no cover the conductive sensing antenna.

Figure 5:
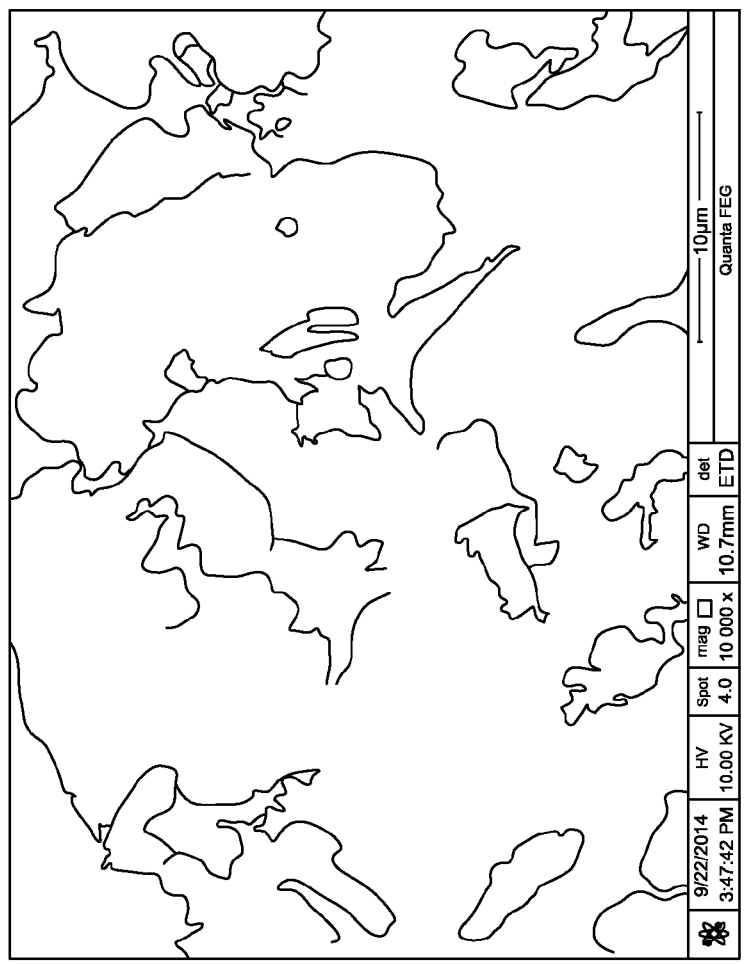
FIG. 5 is SEM image showing surface morphology of a printed RFID antenna sensing mixture with various sensing materials according to a preferred embodiment of the present invention.

FIG. 5 is SEM image showing surface morphology of a printed RFID antenna sensing mixture with various sensing materials according to a preferred embodiment of the present invention.

Preferably, the conductive sensing ink/glue consists of two parts: conductive ink/glue and selected sensing materials.

Preferably, a conductor in the conductive ink/glue is any one of metal, carbon, conductive polymer, and their derived mixtures.

Preferably, the selected sensing material is any one of metal, carbon, polymer, organically modified species, and their derived mixtures.

While the preferred embodiments of the invention have been set forth for the purpose of disclosure, modifications of the disclosed embodiments of the invention as well as other embodiments thereof may occur to those skilled in the art. The scope of the claims should not be limited by the preferred embodiments set forth in the examples, but should be given the broadest interpretation consistent with the description as a whole.

What is claimed is:

1. A printed radio frequency sensor structure comprising: a substrate, a RFID sensing antenna arranged on a top surface of the substrate, and a protection layer covering on the RFID sensing antenna, wherein plural sensing materials are directly introduced into a RFID sensing antenna mixture of a RFID sensor tag;
wherein conductive sensing ink/glue is printed on the substrate, and the conductive sensing ink/glue is dried, cured and compressed so as to form the RFID sensing antenna mixture with the plural sensing materials;
wherein a chip is bonded on the RFID sensing antenna so as to form the RFID sensor tag; and
wherein the protection layer is coated on a top of the RFID sensor tag.

2. A method of preparing a RFID sensor tag comprising steps of:
A). Printing conductive sensing ink/glue on substrate;
B). Drying, curing and compressing the conductive sensing ink/glue to form a conductive RFID sensing antenna mixture with plural sensing materials;
C). Bonding a chip on a RFID sensing antenna to form a RFID sensor tag; and
D). Coating a protection layer on a top of the RFID sensor tag, wherein protection coating fully, partially covers or does not cover the conductive sensing antenna.

3. The method of preparing the RFID sensor tag as claimed in claim 2, wherein the conductive sensing ink/glue consists of two parts: conductive ink/glue and selected sensing materials.

4. The method of preparing the RFID sensor tag as claimed in claim 2, wherein a conductor in the conductive ink/glue is any one of metal, carbon, conductive polymer, and their derived mixtures.

5. The method of preparing the RFID sensor tag as claimed in claim 2, wherein the selected sensing material is any one of metal, carbon, polymer, organically modified species, and their derived mixtures.

* * * * *

UNITED STATES PATENT AND TRADEMARK OFFICE
CERTIFICATE OF CORRECTION

PATENT NO. : 9,639,800 B2  
APPLICATION NO. : 14/824083  
DATED : May 2, 2017  
INVENTOR(S) : Lai et al.

Page 1 of 1

It is certified that error appears in the above-identified patent and that said Letters Patent is hereby corrected as shown below:

On the Title Page

Item (12) "Novoselov, et al." should read -- Lai, et al. --.

Item (72) Inventor is corrected to read:
-- Chung Ping Lai, Zhubei (TW);
Kuo-Hsin Chang, Manchester (GB);
Jia-Cing Chen, Manchester (GB) --.

Signed and Sealed this
Fifth Day of September, 2017

Joseph Matal
*Performing the Functions and Duties of the*
*Under Secretary of Commerce for Intellectual Property and*
*Director of the United States Patent and Trademark Office*